US006396419B1

(12) United States Patent
Yeh

(10) Patent No.: US 6,396,419 B1
(45) Date of Patent: May 28, 2002

(54) VOLUME CONTROL KNOB FOR USE WITH A LAPTOP COMPUTER

(75) Inventor: Shih-Ping Yeh, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 09/524,423

(22) Filed: Mar. 11, 2000

(51) Int. Cl.[7] .............................................. H03M 1/22

(52) U.S. Cl. ........................................ 341/16; 381/109

(58) Field of Search ............................ 341/16; 710/38; 381/104, 109, 107, 118, 26, 306, 58, 124

(56) References Cited

U.S. PATENT DOCUMENTS 5,548,655 A * 8/1996 Takahashi .................. 381/104
5,977,499 A * 11/1999 Black et al. ................ 200/303
6,009,181 A * 12/1999 Kim ........................... 381/109
6,170,024 B1 * 1/2001 Wakeland et al. ............ 710/38

OTHER PUBLICATIONS

Alps Electric Co., Ltd. Data Sheet; Oct. 9, 1997.

* cited by examiner

*Primary Examiner*—Peguy JeanPierre
*Assistant Examiner*—Joseph J Lauture
(74) *Attorney, Agent, or Firm*—Rabin & Berdo, P.C.

(57) ABSTRACT

A volume control knob for use with a laptop computer uses the engagement between the springs and the connecting plates to generate different messages. The messages will then be transmitted to the chip received in the secondary control device. With the messages received by the chip, the volume of the laptop computer is controlled.

7 Claims, 15 Drawing Sheets

VOLUME CONTROL KNOB FOR USE WITH A LAPTOP COMPUTER

FIELD OF THE INVENTION

The present invention relates to a volume control knob, and more particularly to a volume control knob for use with a laptop computer. With the knob, the user is able to control the volume of the laptop computer directly, as well as the volume control software.

BACKGROUND OF THE INVENTION

Traditionally, a laptop computer uses a volume control software to control the volume. There is no other auxiliary device provided to control the volume. However, due to the bug in the software, a variable resistance is introduced to control the volume of the laptop. Still, the variable resistance has the following disadvantages:

1. not easy to control the volume

Because the manner of using a variable resistance to control the volume of a laptop has nothing to do with the software, the user might be confused as to what he/she should adjust to control the volume.

2. easy to have malfunction

After a long period of using the variable resistance, the mechanical parts of the variable resistance may have bad connection, which causes inaccuracy of controlling the volume or can not adjust the volume at all. That is, the user will have to send the laptop for repair quite often. To overcome the aforementioned problems, a later improvement to control the volume of the laptop is to directly use the keyboard, so called "Hot Key" to complete the work. However, because the user complains about the inconvenience of using a single hot key to control the volume, using two keys to control the volume of the laptop is then invented to facilitate the control. But still, using two keys to control the volume confronts the same problem of inconvenience.

Therefore, it is an objective of the invention to provide a volume control knob to mitigate and/or obviate the aforementioned problems.

SUMMARY OF THE INVENTION

The primary objective of the invention is to provide a volume control knob with which the volume of a laptop computer is controlled. The volume control knob uses a variable resistance as the switch to control the volume, which is easy to operate and needs almost no extra attention.

Another objective of the invention is to provide a knob having a mute function, such that when the user does not want to bother others, the user only needs to press the knob to dramatically reduce the volume.

Still another objective of the invention is to provide a volume control knob which is able to simultaneously control the volume control software so as that the user will not be confused when adjusting the volume next time.

Other objects, advantages and novel features of the invention will become more apparent from the following detailed description when taken in conjunction with the accompanying drawings.

DETAILED DESCRIPTION OF PREFERRED EMBODIMENT

Figure 1:
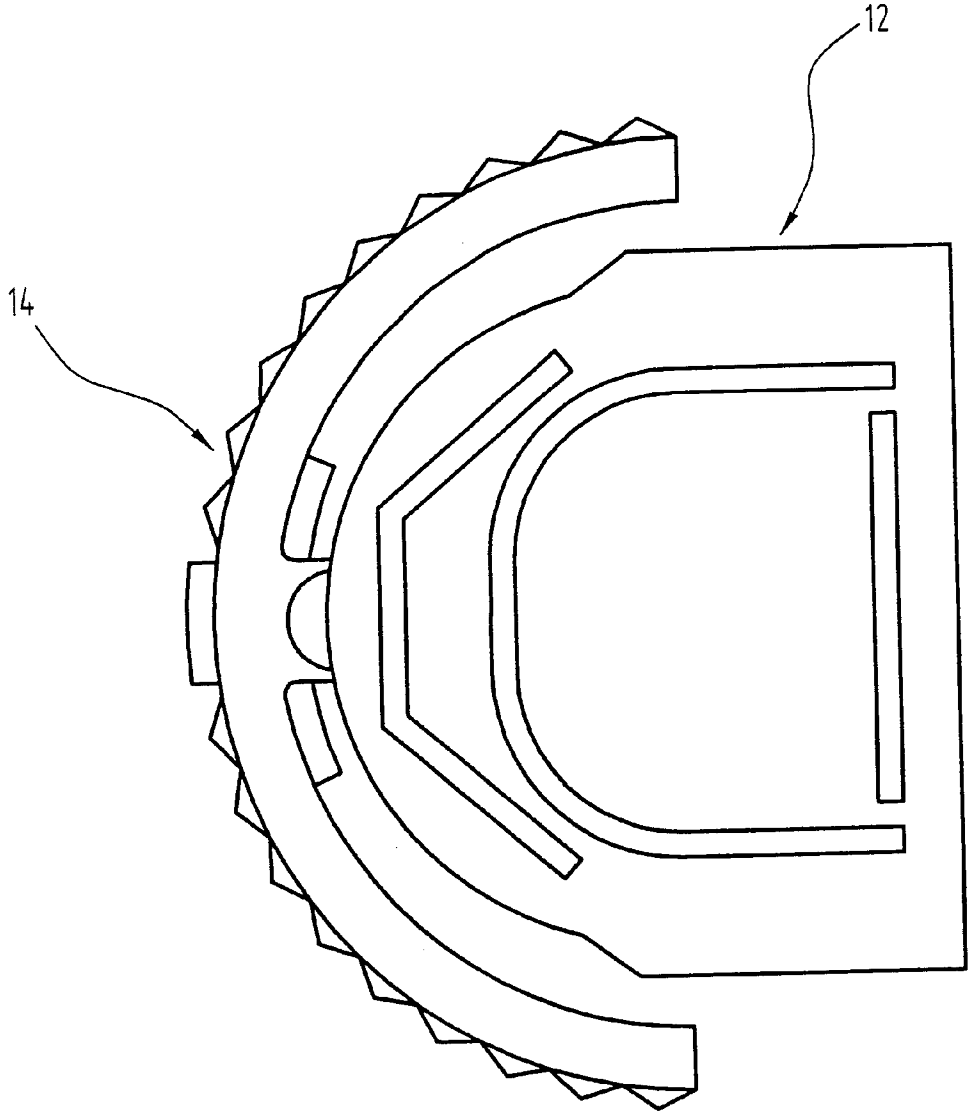
FIG. 1 is a top plan view showing a volume control knob in accordance with the present invention.

With reference to FIG. 1 of the first preferred embodiment of the invention, the volume control knob (12) has a primary control device (14). The volume control knob (12) uses digital control method (i.e., digital control signals) to control the volume of the laptop computer.

Figure 2A:
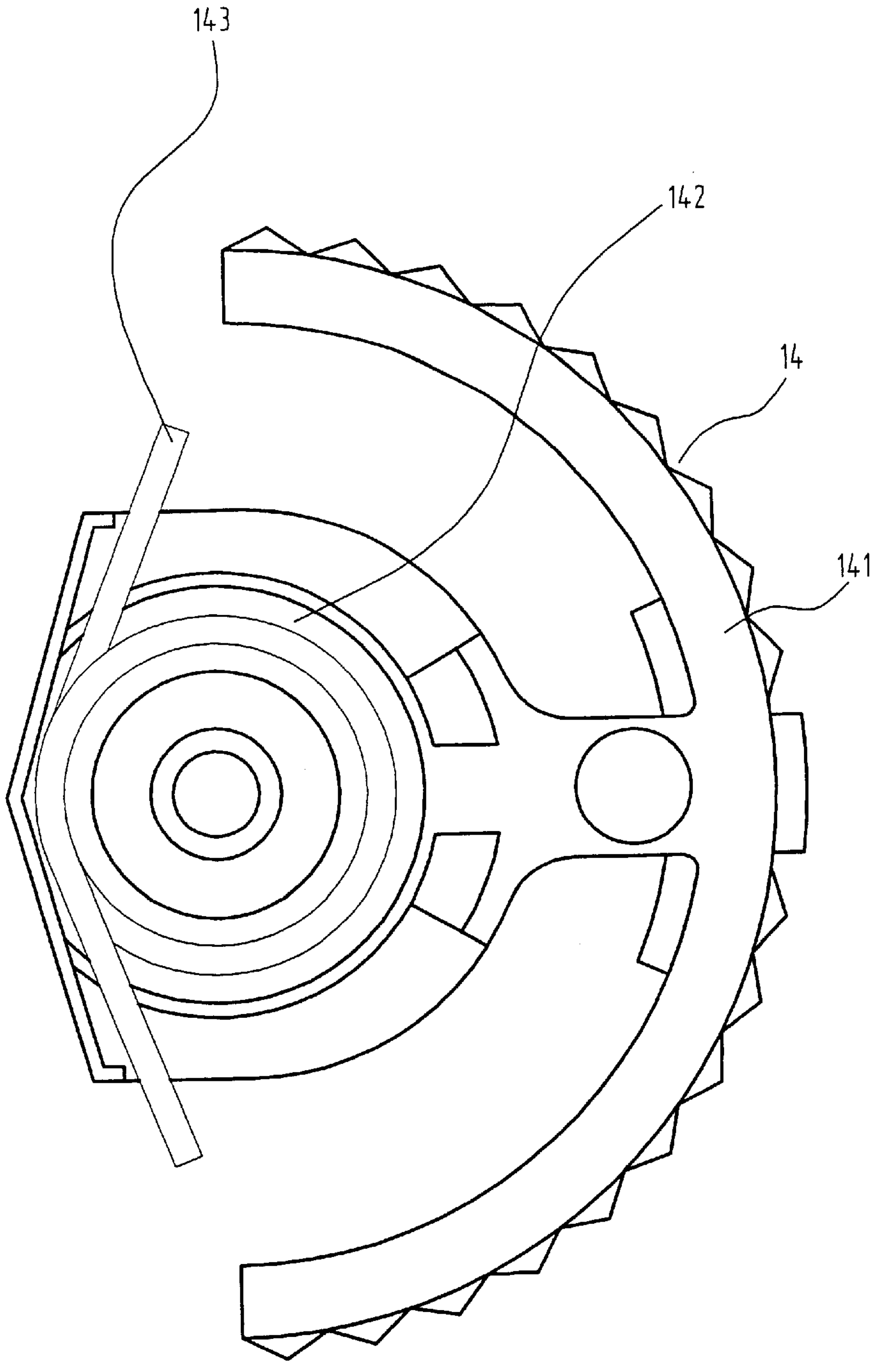
FIG. 2*a* is a top plan view showing a primary control device of the invention.

With reference to FIG. 2*a*, the primary control device (14) has a control disc (141), an annular recess (142) defined in a connecting member (not numbered) securely connected with the control disc (141) and a leaf spring (143) received in the annular recess (142) with its two distal ends extending out respectively in different directions.

Figure 2B:
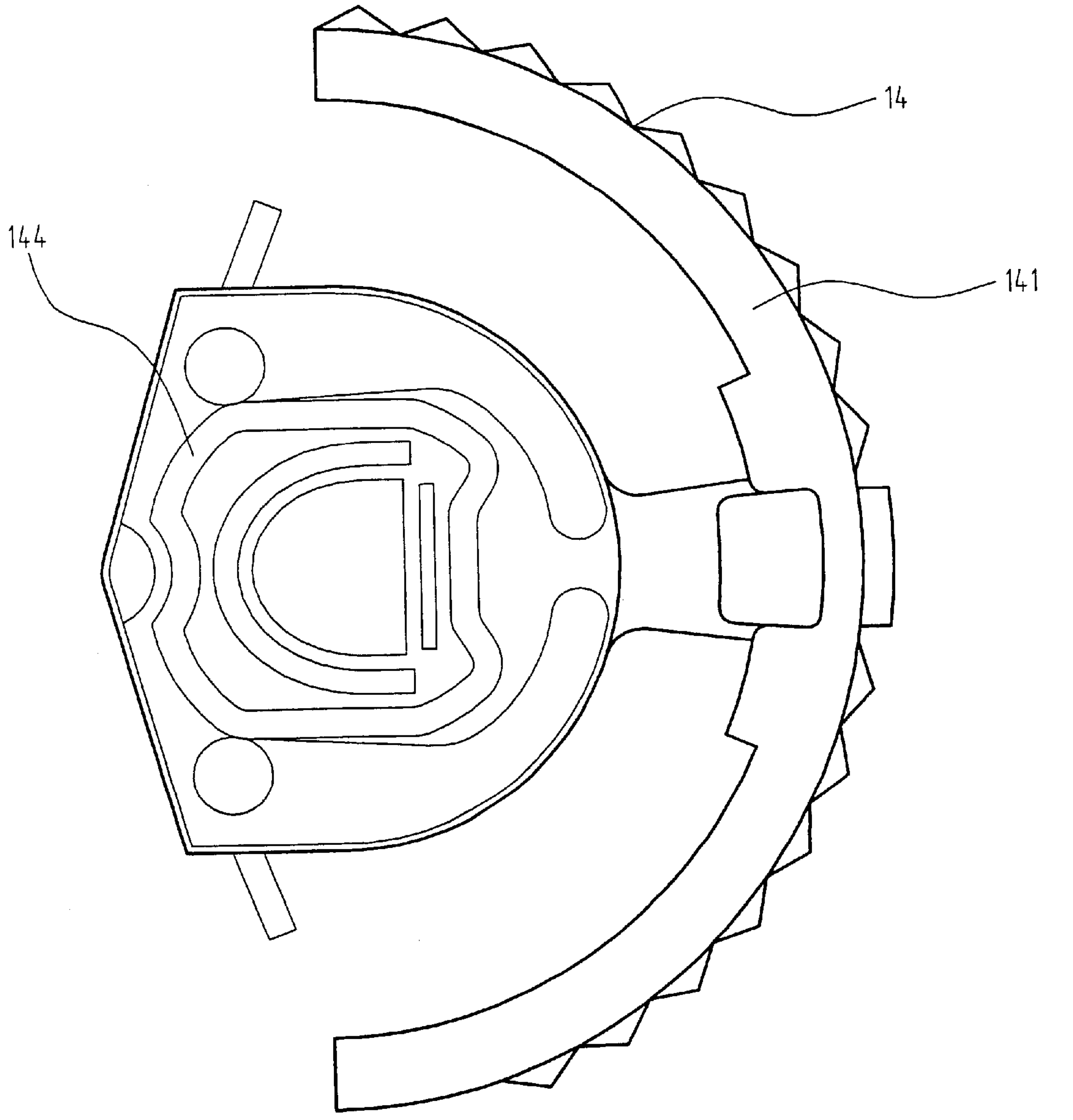
FIG. 2*b* is a bottom plan view showing a primary control device of the invention.
Figure 3:
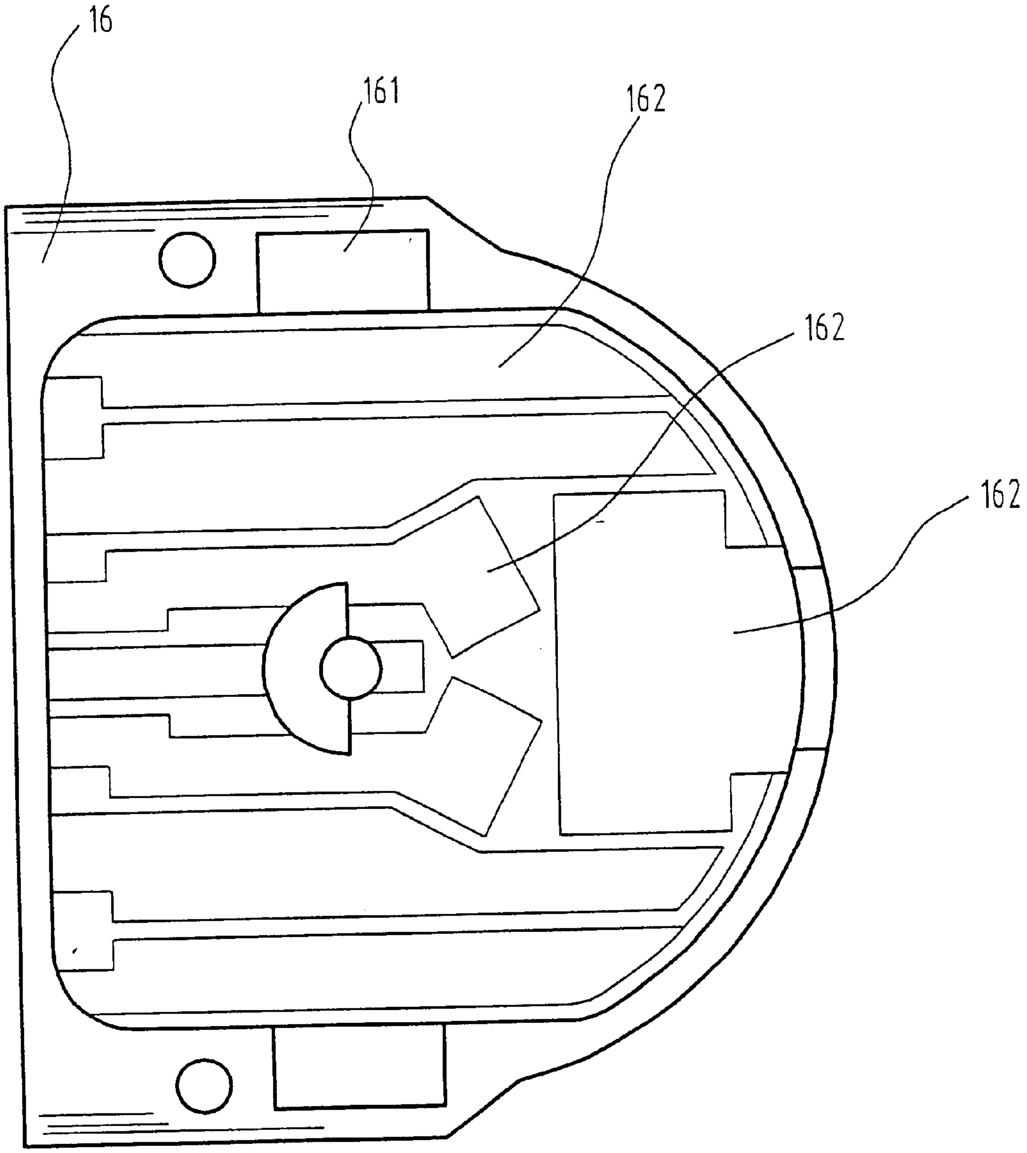
FIG. 3 is a top plan view showing a secondary control device of the invention.
Figure 4:
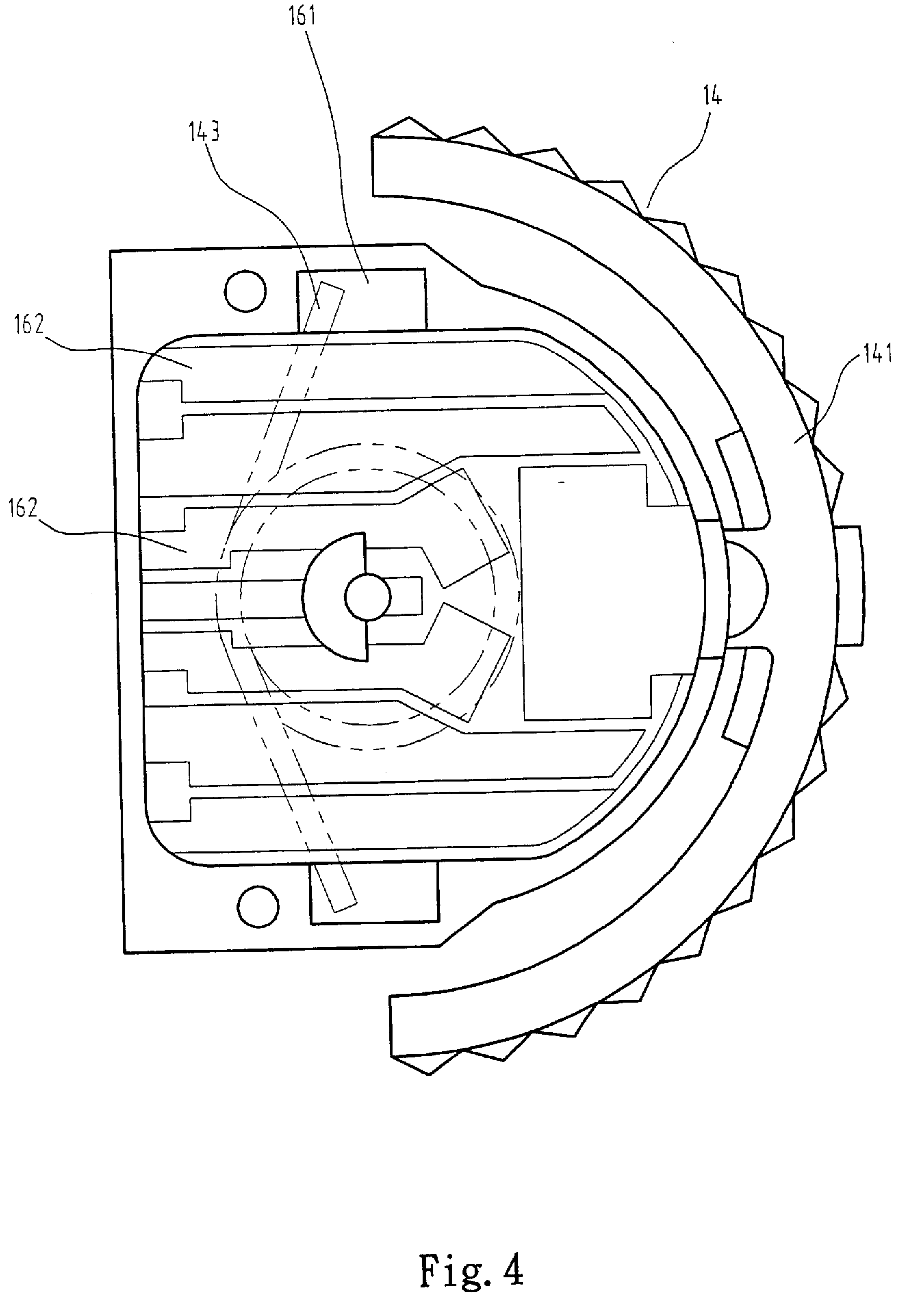
FIG. 4 is a top plan view showing the combination between the primary control device and the secondary control device.

With reference to FIG. 3, the secondary control device (16) has two elongate notches (161) and multiple chips (162) respectively defined and mounted in a base (not numbered). As shown in FIG. 4, when the primary control device (14) is assembled with t h e secondary control device (16), the two distal ends of the leaf spring (143) respectively rest in o ne of the two notches (161). With such a structure, the control disc (141) is able to move up and down with respect to the secondary control device (16) and is able to move inward. With the assistance of the recoil force of the leaf spring (143), after the control disc (141) moves inward, the control disc (141) is able to return to its original position. The primary control device (14) further has multiple connecting plates (144),shown in FIG. 2*b*, securely mounted thereon, such that when the control disc (141) moves upward, downward or inward with respect to the secondary control device (16), the contact between the connecting plates (144) and the multiple chips (162) will therefore generate different messages (i.e., control signals) with which, the volume control knob (12) uses as a control switch.

Figure 5:
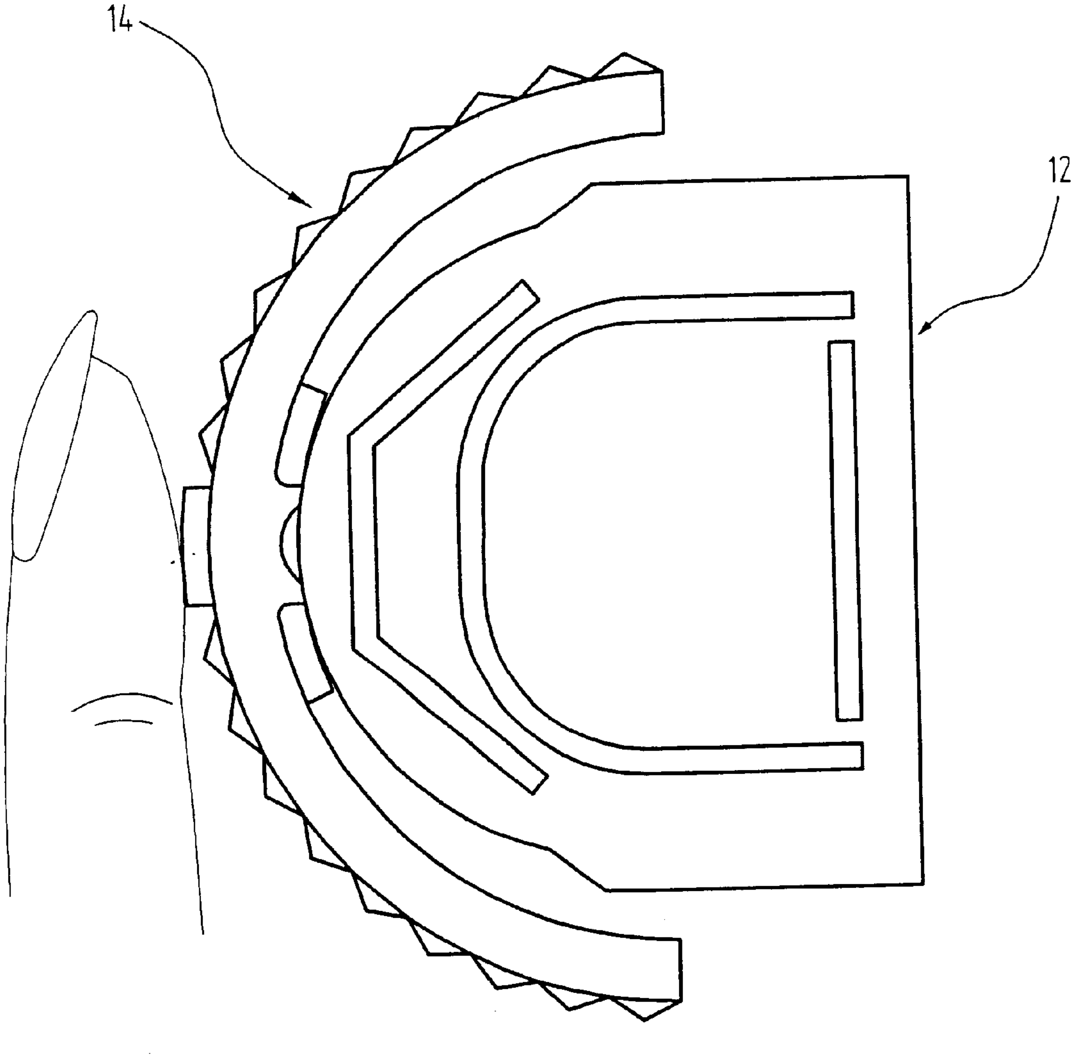
FIG. 5 is a schematic view showing the user is controlling the volume control knob of the invention with the finger.
Figure 6:
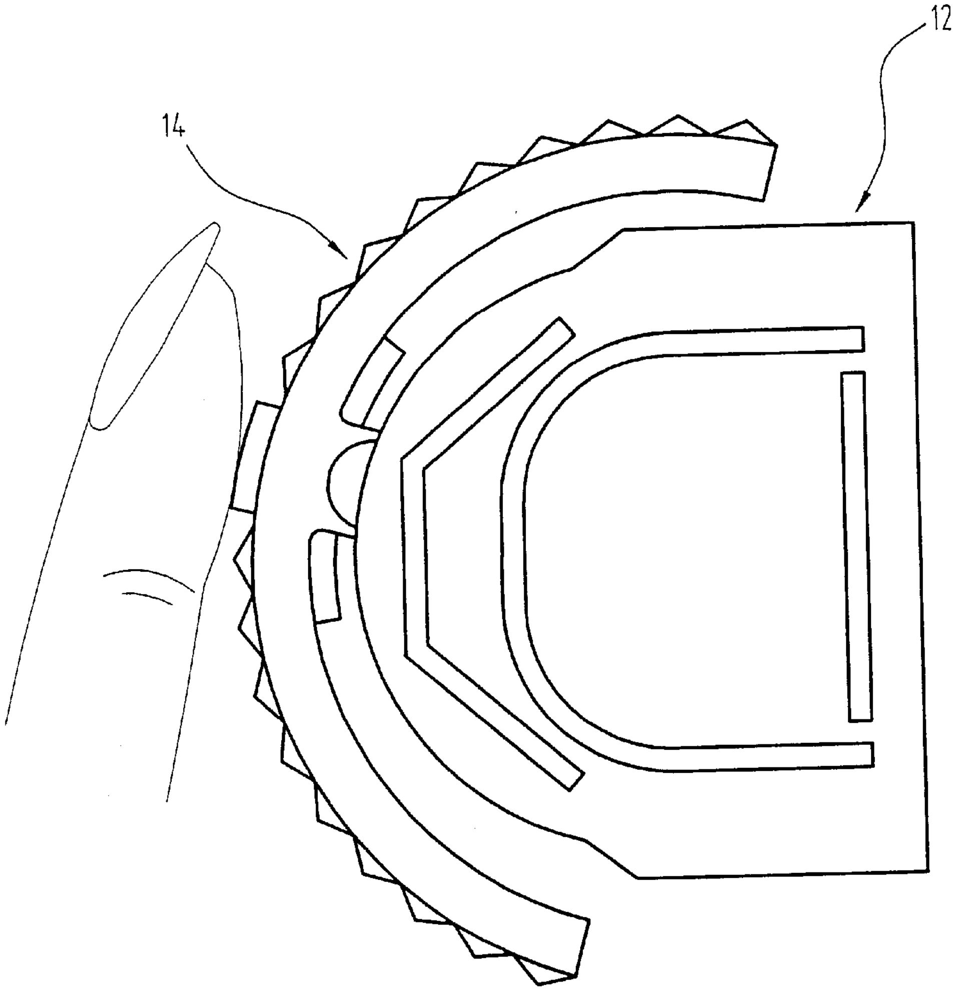
FIG. 6 is a schematic view showing the user is rotating the volume control knob clockwise.
Figure 7:
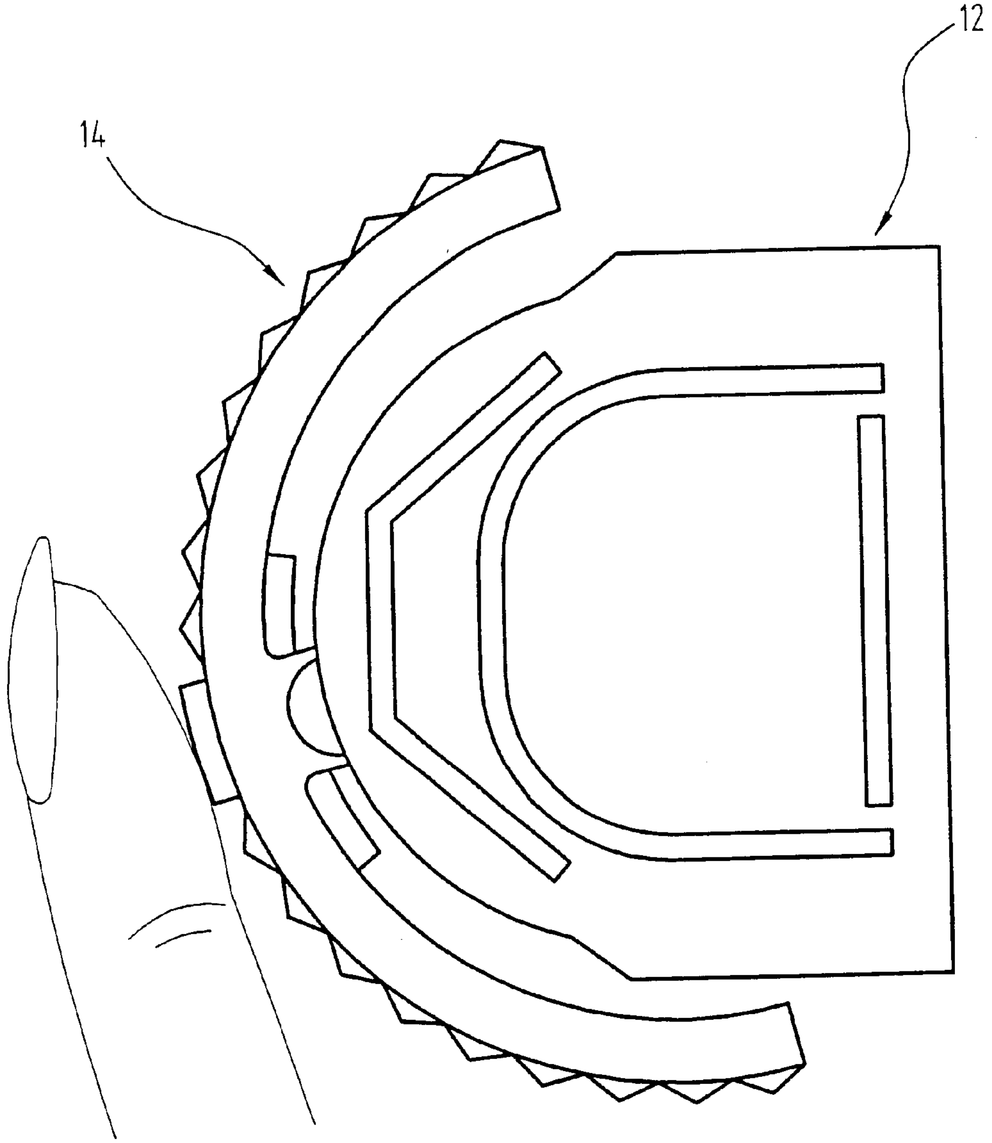
FIG. 7 is a schematic view showing the user is rotating the volume control knob counterclockwise.
Figure 8:
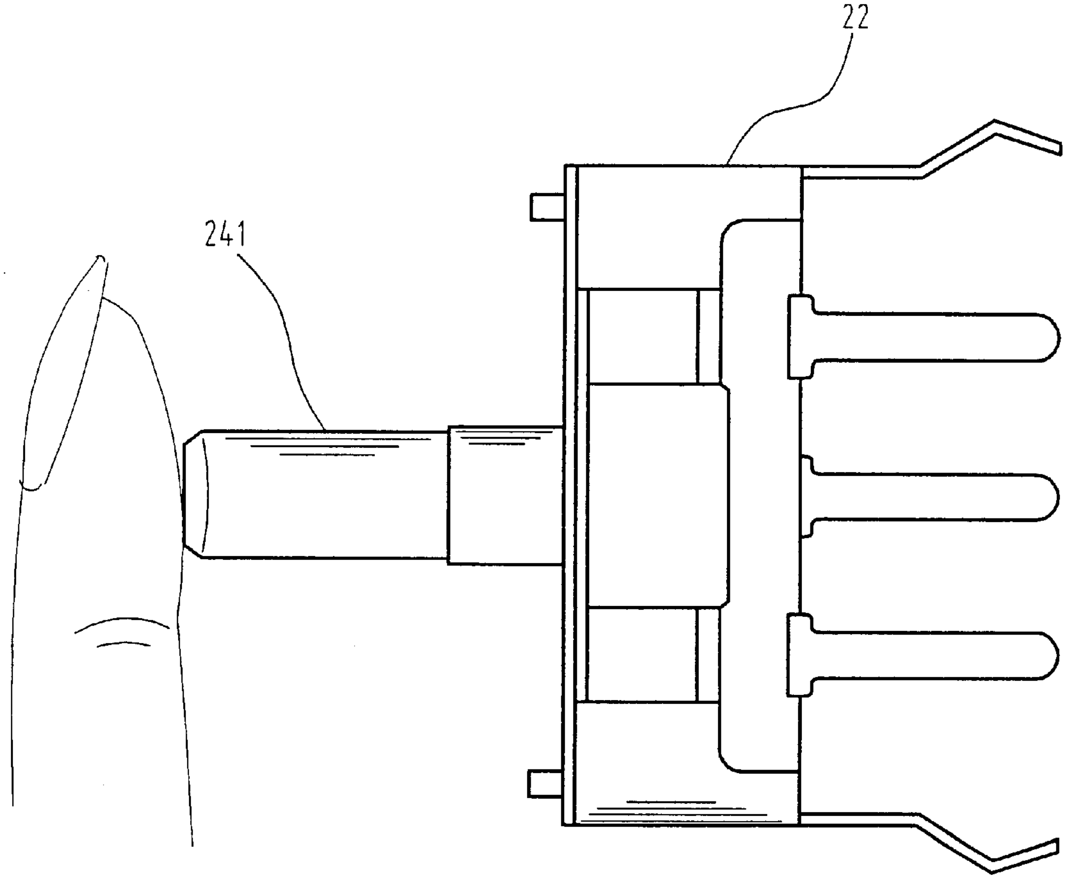
FIG. 8 is a side view showing the second preferred embodiment of the invention.
Figure 9:
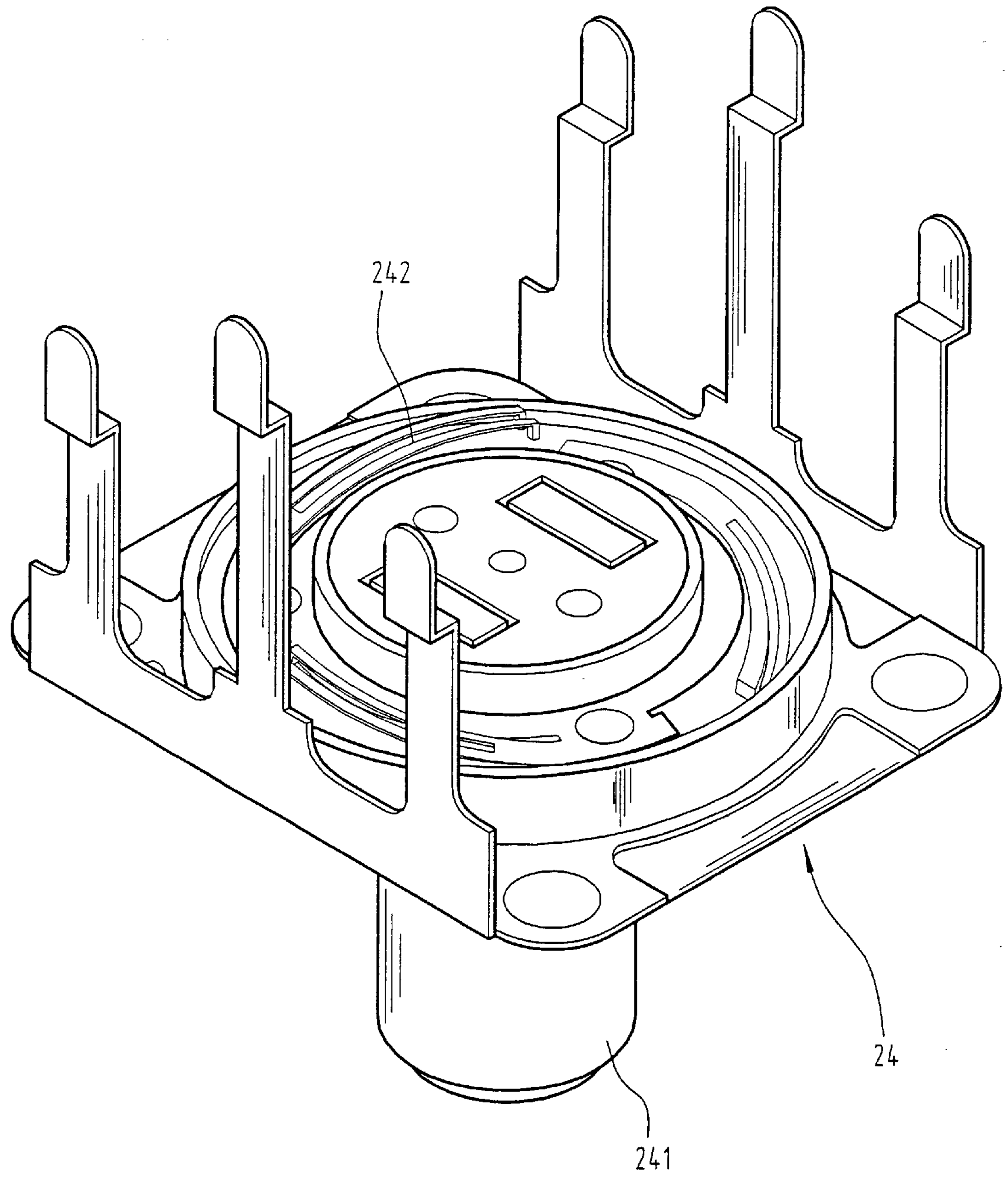
FIG. 9 is a perspective view showing a primary control device constructed in accordance with the second preferred embodiment.
Figure 10:
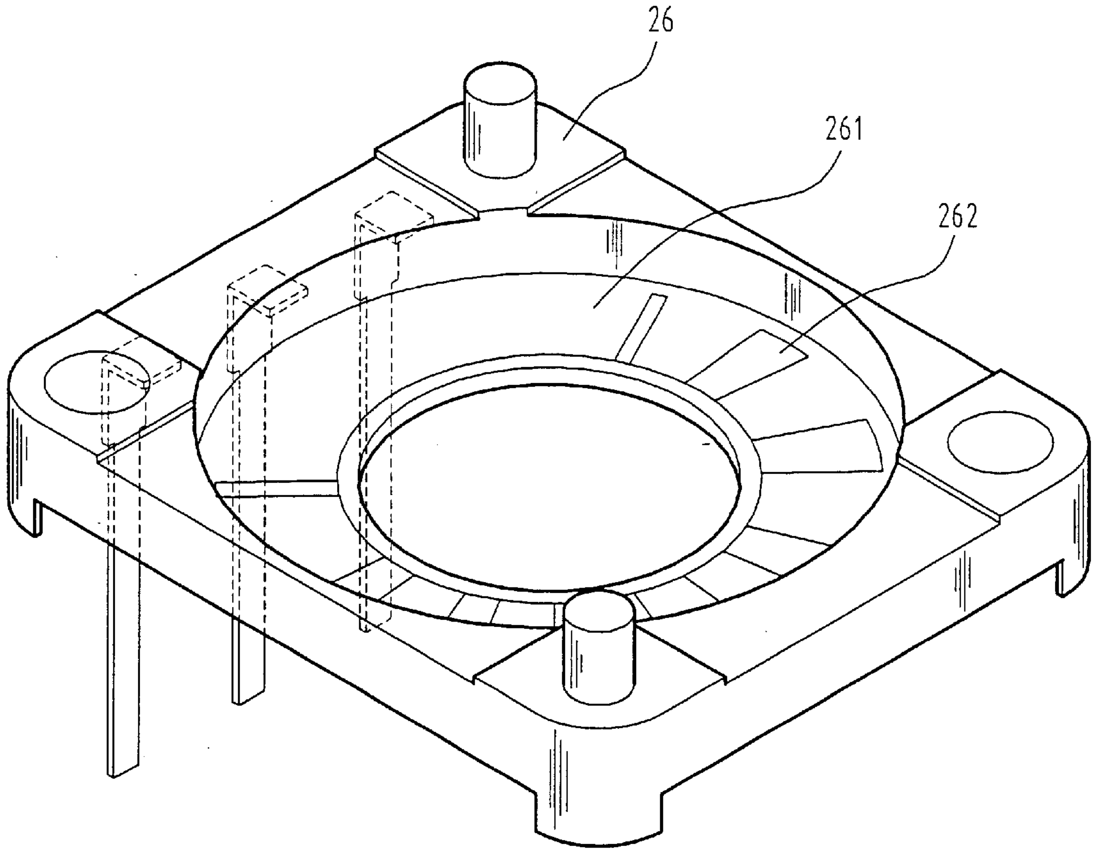
FIG. 10 is a perspective view showing a mediate control device constructed in accordance with the second preferred embodiment.
Figure 11:
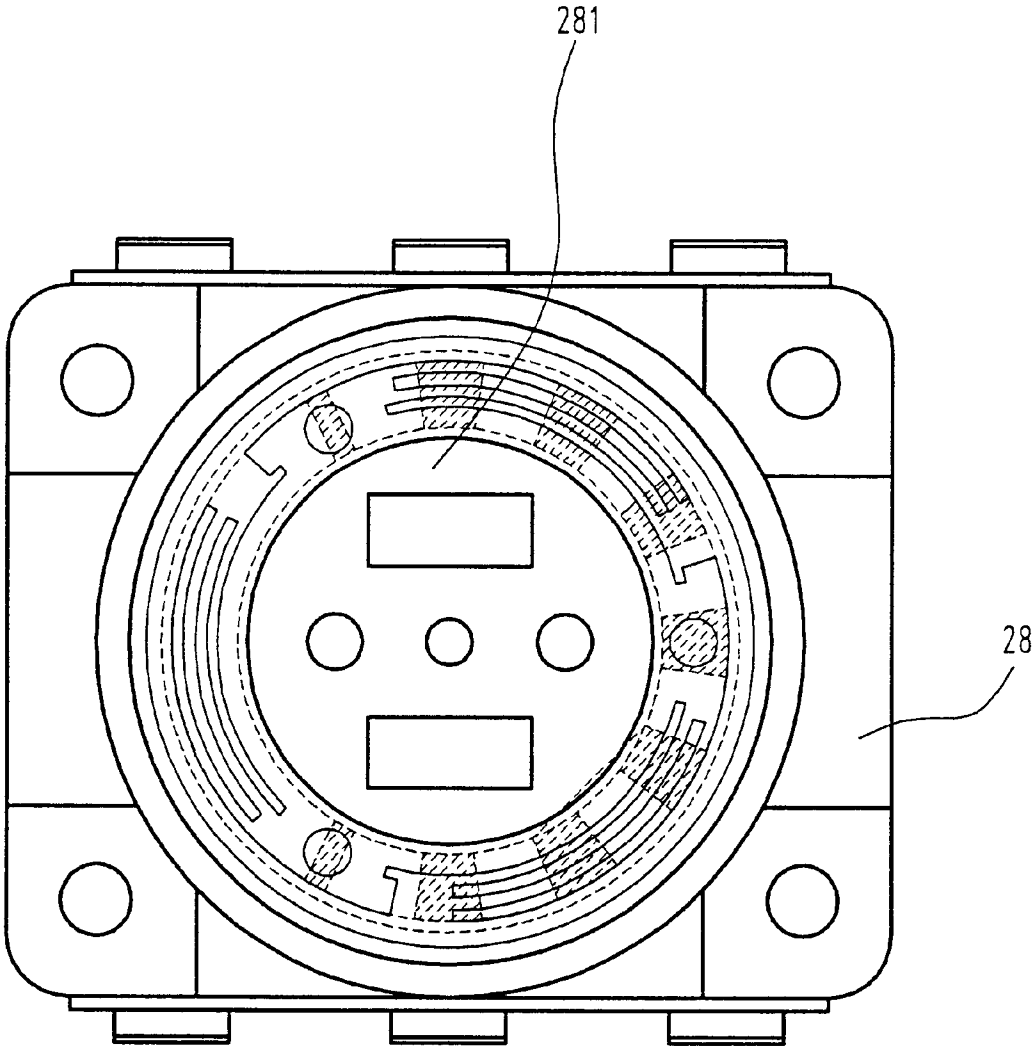
FIG. 11 is a perspective view showing a secondary control device constructed in accordance with the second preferred embodiment.

With reference to FIGS. 5, 6 and 7, besides the movements described above, the volume control knob (12) is controlling the volume by rotating clockwise to increase the volume and to decrease the volume by rotating the knob counterclockwise. Furthermore, when pressing the knob, the laptop computer is in silence. That is, when the knob is pressed, the laptop is in mute mode.

Referring to FIGS. 8, 9, 10 and 11, it is to be noted that the second preferred embodiment is shown. The volume control knob (22) has a primary control device (24), a mediate control device (26) and a secondary control device (28). The primary control device (24) is mounted on top of the mediate control device (26) and the secondary control device (28) is mounted below the mediate control device (26). The primary control device (24) has a controlling rod (241) and multiple helical springs (242) securely connected with one distal end of the controlling rod (241), such that when the controlling rod (241) is rotated, the springs (242) will simultaneously be rotated. Furthermore, the controlling rod (241) is able to return to its original position after being pressed with the assistance of the recoil force of the springs (242). The mediate control device (26) has a annular recess (261) defined therein and multiple connecting plates (262) securely received in the annular recess (261). The secondary control device (28) has a chip (281) mounted therein for transmitting messages.

When the above mentioned components are assembled, the helical springs (242) are received in the annular recess (261) and engage with the connecting plates (262) and the annular recess (261) engages with the chip (281). With such an arrangement, the volume control knob (22) of the invention is able generate different messages by rotating clockwise, counterclockwise or even pressing the controlling rod (241) as a control switch to control the volume of the laptop.

Figure 12:
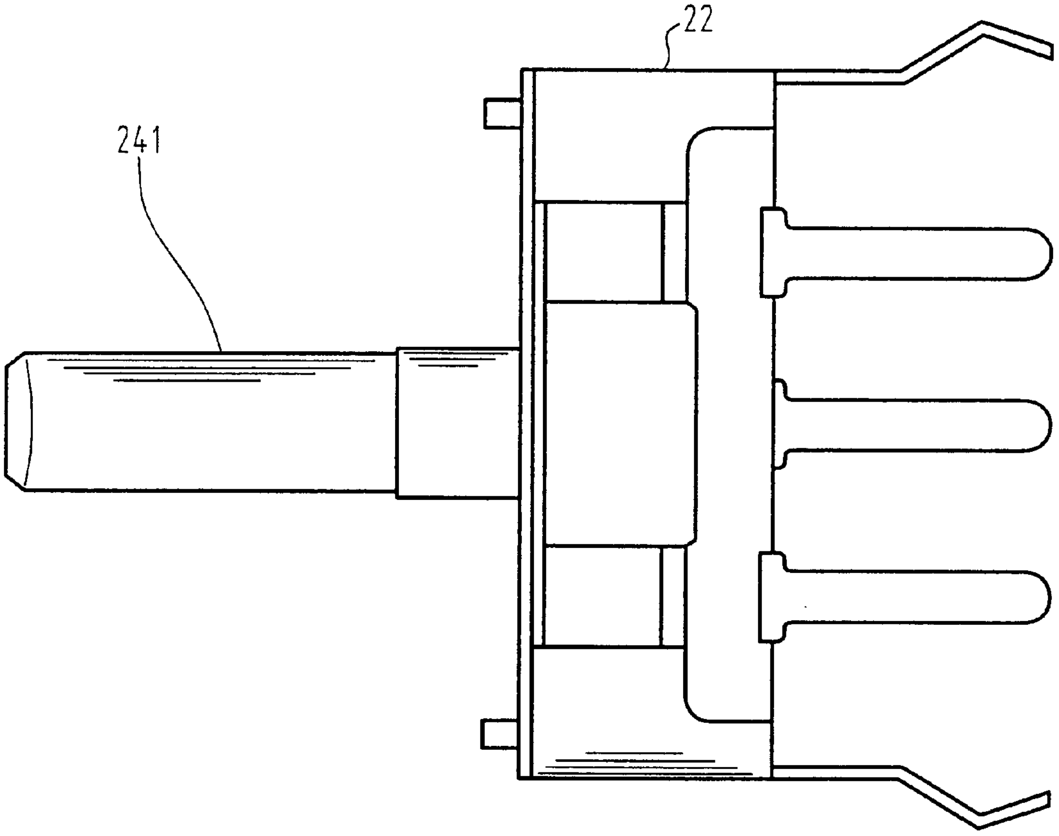
FIG. 12 is a side view showing the assembled volume control knob of the second preferred embodiment.
Figure 13:
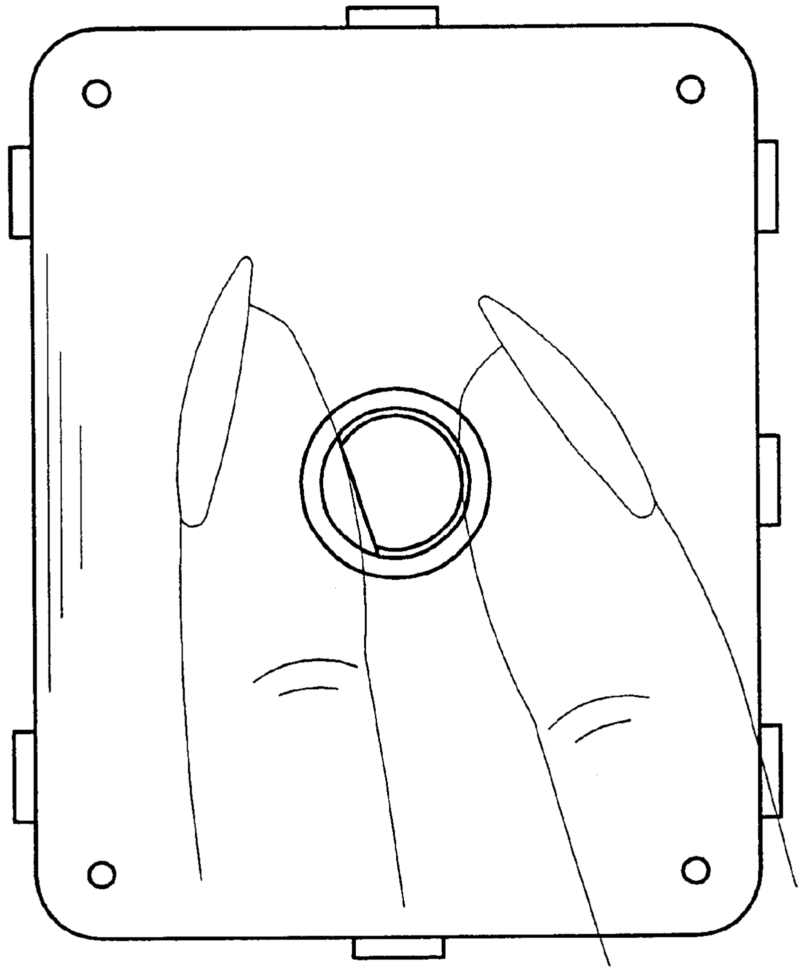
FIGS. 13 and 14 are schematic views showing that the user is rotating the volume control knob to control the volume of the laptop computer.
Figure 14:
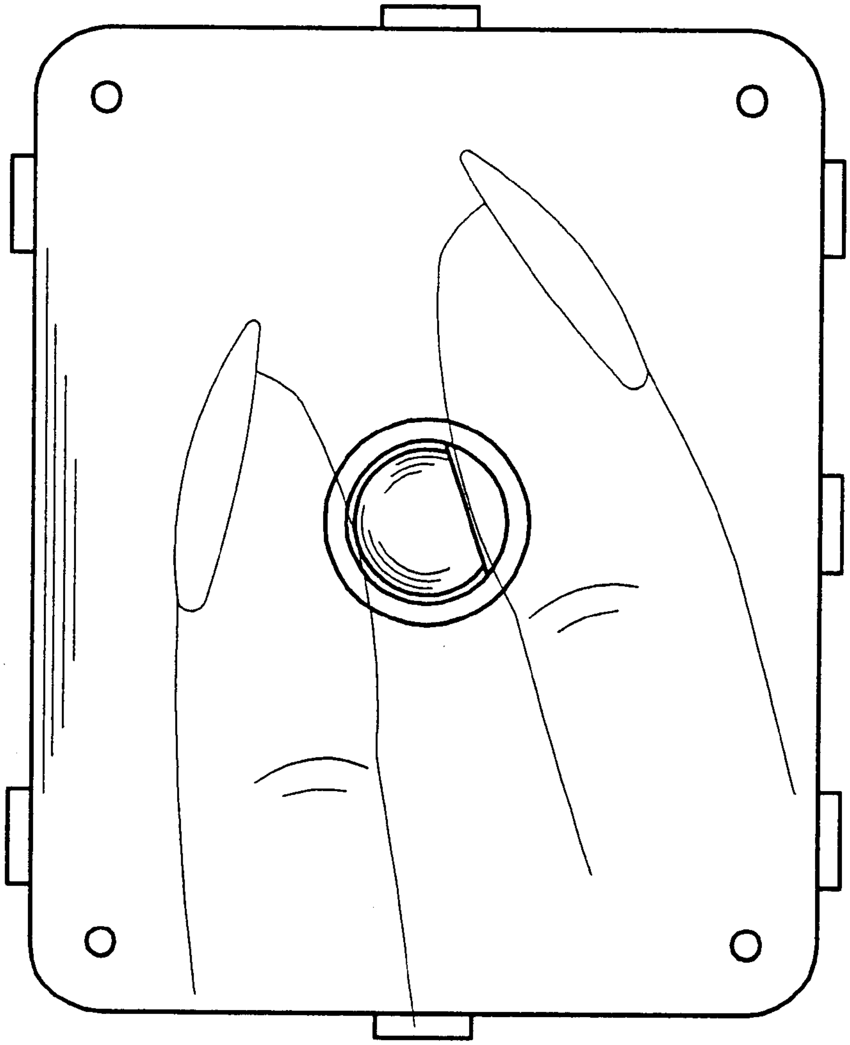

With reference to FIGS. 12, 13, 14, the rotation of the volume control knob (22) is to control the volume of the laptop and the pressing thereof is to set the laptop in mute mode.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. In combination, a computer, and a volume control knob for controlling said computer, said volume control knob comprising:

a primary control device with a resilient member, said primary control device being rotatable in a first direction, and rotatable in a second direction that is opposite to the first direction, and being pushable; and a secondary control device with at least one chip mounted thereon, and being rotatably engaged with distal ends of the resilient member, wherein when said primary control device is rotated in the first direction, said primary control device engages said chip to generate a first control signal to increase a volume of said computer;

wherein when said primary control device is rotated in the second direction, said primary control device engages said chip to generate a second control signal to decrease the volume of said computer;

wherein when said primary control device is pushed, said primary control device engages said chip to generate a third control signal to mute the volume of said computer; and wherein said resilient member returns said primary control device to an original position after being rotated in the first direction, after being rotated in the second direction, and after being pushed.

2. The combination recited in claim 1, wherein the resilient member is a leaf spring provided adjacent to the secondary control device, with which the primary control device is able to move upward, downward and inward respect to the secondary control device and to return to its original position.

3. The combination recited in claim 1, wherein said computer is a laptop computer.

4. The combination recited in claim 1, wherein said at least one chip comprises a plurality of chips.

5. The combination recited in claim 2, wherein the primary control device has a control disc and a connecting member securely connected with the control disc, said connecting member having an annular recess defined therein, said leaf spring being received in the annular recess with two distal ends of the leaf spring extending out respectively in different directions.

6. In combination, a computer, and a volume control knob for controlling said computer, said volume control knob comprising:

a primary control device having a controlling rod and multiple helical springs securely connected with one distal end of the controlling rod, said controlling rod being rotatable in a first direction, and rotatable in a second direction that is opposite to the first direction, and being pushable, wherein when the controlling rod is rotated, the springs will simultaneously be rotated;

a mediate control device mounted below the primary control device and having an annular recess defined therein for receiving the helical springs and multiple connecting plates securely received in the annular recess and rotatably connected with the helical springs;

a secondary control device having at least one chip provided to engage with the annular recess for transmitting messages.

wherein when said controlling rod is rotated in the first direction, said mediate control device is caused to engage said chip to generate a first control signal to increase a volume of said computer;

wherein when said controlling rod is rotated in the second direction, said mediate control device is caused to engage said chip to generate a second control signal to decrease the volume of said computer;

wherein when said controlling rod is pushed, said mediate control device is caused to engage said chip to generate a third control signal to mute the volume of said computer; and wherein said springs return said controlling rod to an original position after being pushed.

7. The combination recited in claim 6, wherein said computer is a laptop computer.

* * * * *